United States Patent [19]

Douziech et al.

[11] Patent Number: 4,918,529
[45] Date of Patent: Apr. 17, 1990

[54] DEVICE FOR SETTING MINIMAL AND MAXIMAL FREQUENCIES OF A FREQUENCY MODULATED VIDEO SIGNAL

[75] Inventors: Patrick Douziech; Philippe Berger, both of Villingen, France

[73] Assignee: SGS-Thomson Microelectronics S.A., Gentilly, France

[21] Appl. No.: 201,412

[22] Filed: Jun. 2, 1988

[30] Foreign Application Priority Data

Jun. 5, 1987 [FR] France ............................. 87 07942

[51] Int. Cl.$^4$ ............................................. H04N 5/52
[52] U.S. Cl. ..................................... 358/174; 358/170; 358/188; 358/195.1
[58] Field of Search ............... 358/188, 174, 170, 169, 358/166, 164, 160, 25, 23, 158, 195.1

[56] References Cited

U.S. PATENT DOCUMENTS 4,163,259 7/1979 Skerlos ......................... 358/195.1
4,608,604 8/1986 Lilley ........................... 358/188

FOREIGN PATENT DOCUMENTS 0122095 10/1984 European Pat. Off.
782878 9/1957 United Kingdom.
2019145 10/1979 United Kingdom.

Primary Examiner—Tommy P. Chin
Attorney, Agent, or Firm—Lowe, Price, LeBlanc, Becker & Shur

[57] ABSTRACT

A frequency control apparatus automatically sets minimum and maximum reference frequencies ($f_{min}$ and $f_{max}$) of a frequency modulated video luminance signal. An insertion circuit receives first and second reference voltages corresponding to $f_{min}$ and $f_{max}$ output from an AGC amplifier of a video tape recorder, wherein $f_{min}$ and $f_{max}$ are synchronized with first and second control signals. A discriminator receives one of the reference frequencies, $f_{min}$ or $f_{max}$, together with the frequency modulated video signal from a voltage controlled oscillator of the video tape recorder and generates two voltage levels related to the input frequencies. A comparator receives one of the two voltage levels from the discriminator, generating a difference voltage corresponding to the difference between the two input voltage levels. An output of the comparator is provided to a switch which is controlled by third and fourth control signals so that the output level of the comparator controls either (a) the setting of the gain of a variable gain amplifier of the video tape recorder or (b) feeds one of the inputs of an adder of the video tape recorder. The switch is responsive to the reference frequency supplied to the discriminator to servo-control the video signal output by the voltage controlled oscillator either by $f_{min}$ or $f_{max}$.

5 Claims, 3 Drawing Sheets

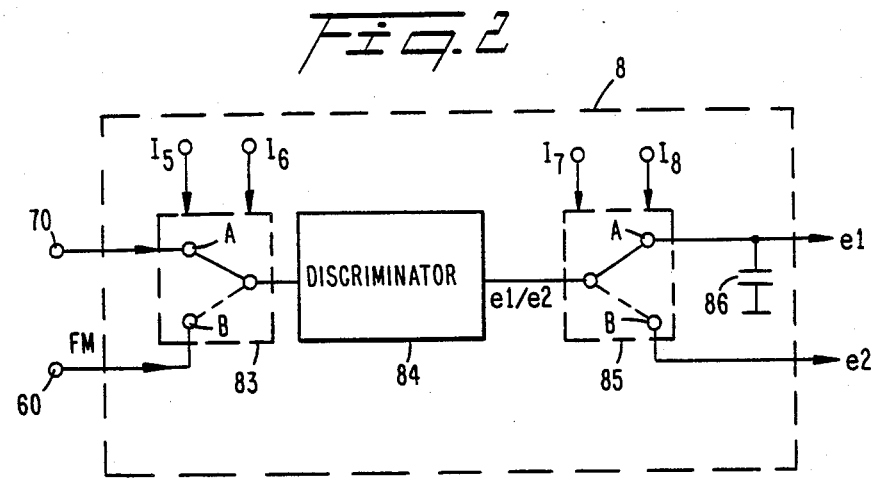
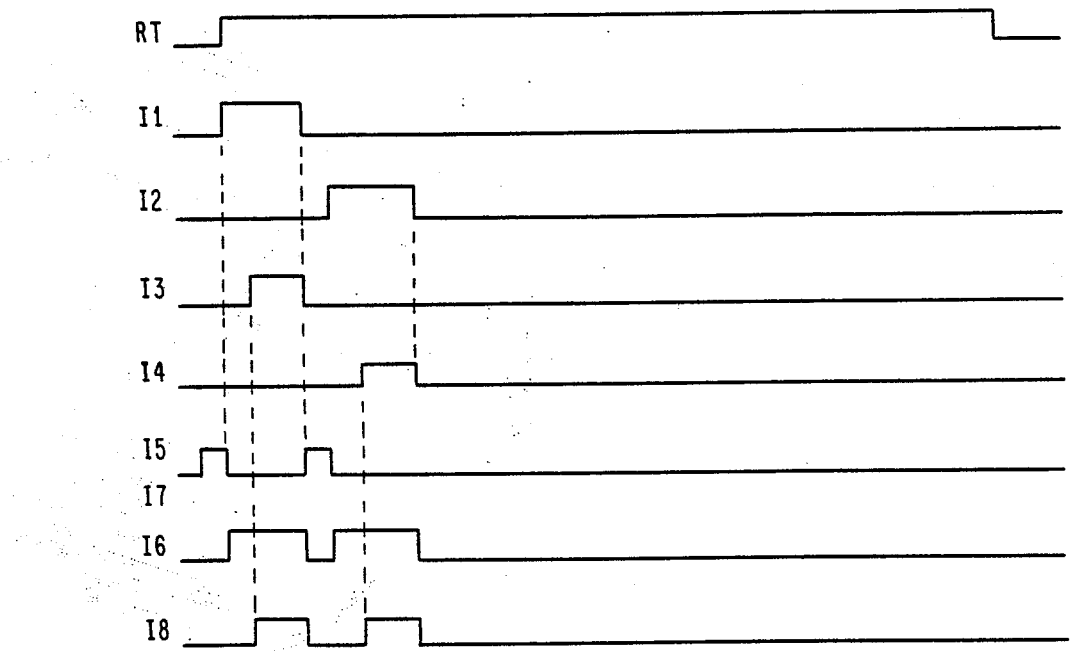

DEVICE FOR SETTING MINIMAL AND MAXIMAL FREQUENCIES OF A FREQUENCY MODULATED VIDEO SIGNAL

The instant invention relates to a device for setting the frequencies $f_{min}$ and $f_{max}$ of a frequency modulated video signal.

BACKGROUND OF THE INVENTION

The invention relates more particularly to the frequency modulated luminance signal used in the VHS or 8 mm video tape recorders prior to the recording of this signal on the magnetic tape.

For example, with VHS models, the frequency modulation of the luminance signal has, as a minimum frequency, a frequency of 3.8 MHz which corresponds to the blanking level of the synchronization pulse and as a maximum frequency, a frequency of 4.8 MHz which corresponds to the maximum white level. Those two frequencies $f_{min}$ and $f_{max}$ have a tolerance of 100 kHz as well as for their difference which also has a tolerance of 100 kHz, those tolerances being assigned by the PAL and SECAM standards for VHS.

It is of common use to carry out a setting of those frequencies at the factory, before putting the sets for sale. The adjustment is made once for all, manually, by means of two potentiometers. The first potentiometer is connected with the gain setting input of an amplifier which receives the luminance signal, and a second potentiometer is connected with the input of an adder which receives, on another input, the output signal of this variable gain amplifier, the output signal of this adder being applied to the input of a voltage-controlled oscillator which permits the frequency modulation of the luminance signal. The setting of the frequency $f_{max}$ is made from a video signal corresponding to the white level, this signal being injected into an input of the amplifier which receives on another input a voltage level corresponding to the blanking level which determines the frequency $f_{min}$ of demodulation. The setting by means of the first potentiometer permits to increase or decrease the gain on the difference between the input levels. The setting of frequency fmin is carried out by means of the second potentiometer which resets the voltage level received by the adder at one input in order to obtain the desired $f_{min}$ frequency.

The settings carried out by this method are tedious and lack accuracy. Further, they are carried out only once for all from a specific video signal.

SUMMARY OF THE INVENTION

The object of the invention is to remedy those problems and to provide for an automatic setting device of the frequencies $f_{min}$ and $f_{max}$, this setting being made on all the frames of the video signal that is to be recorded.

The aim of the invention is therefore to provide for a setting device of the frequencies $f_{min}$ and $f_{max}$ of a frequency modulated signal, comprising in series an amplifier with an automatic gain control, a processing circuit of the luminance signal, a variable gain amplifier, an adder, a voltage-controlled oscillator, further comprising:

an insertion circuit located between the amplifier and the processing circuit, which receives from the amplifier a first level of reference voltage corresponding to the minimum frequency and a second level of reference voltage corresponding to the maximum frequency, respectively synchronized with a first and a second control signal;

a frequency generator adapted to produce at least two reference frequencies $f_{min}$ and $f_{max}$ synchronized with the control signals;

a discrimination circuit which receives at one input, in relation with the control signals, either the frequency $f_{min}$, or the frequency $f_{max}$ from the generator and at another input, the output of the frequency modulated signal of the oscillator, and which provides two voltage levels in relation with the input frequencies a comparator receiving at each of its inputs one of the output voltage levels of the discriminator and providing a voltage level corresponding to the difference between the two input levels;

a switch connected with the output of the comparator and controlled by third and fourth control signals so that the output level of the comparator permits either the setting of the gain of the variable gain amplifyer, or the feeding of the inputs of the adder depending on whether the reference frequency at the input of the discriminator is the minimum frequency or the maximum frequency in order to servo-control the output modulated signal of the oscillator by either the reference frequency $f_{min}$ or the reference frequency $f_{max}$.

BRIEF DESCRIPTION OF THE DRAWINGS

Other features and advantages of the instant invention will clearly appear in the following detailed description of preferred embodiments, in connection with the attached drawings, wherein:

FIG. 2 shows a variation of the discrimination circuit according to FIG. 1,

FIG. 3 shows the time chart of the control signals,

DESCRIPTION OF PREFERRED EMBODIMENTS

Figure 1:
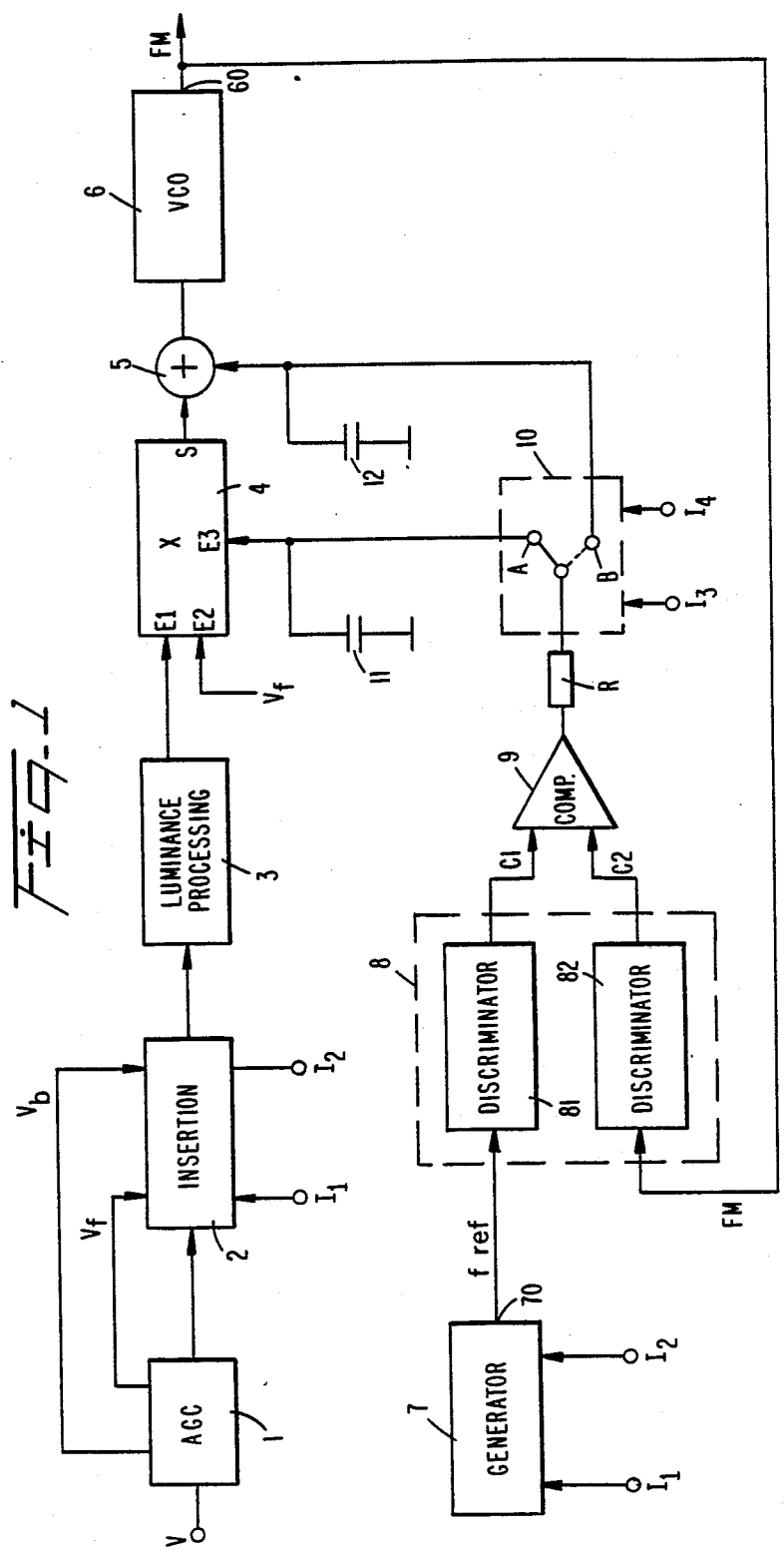
FIG. 1 shows an embodiment of the device according to the invention.

The video signal V which is made up at this processing stage only of the luminance signal is applied at the input of an automatic gain control amplifier 1 as shown in FIG. 1. An insertion circuit 2 receives on one input the signal emitted by amplifier 1. Circuit 2 also receives on two other inputs the reference voltage levels Vb and Vf obtained from amplifier 1.

Level Vb corresponds to the maximum white level and permits to determine the frequency $f_{max}$ for the modulation which will be made upon the luminance signal.

Level Vf corresponds to the blanking level of the synchronization pulse and permits to determine the frequency $f_{min}$ for the modulation of the luminance signal.

This circuit 2 is controlled by two control signals I1 and I2. Signal I1 permits to insert the level corresponding to the blanking level when this blanking signal is present on the video signal V. Signal I2 permits to insert the level corresponding to the maximum white when this signal is present on the video signal V.

A processing circuit 3 of the luminance signal permits to carry out a preaccentuation for high frequencies. The preaccentuation processing on the luminance signal is conventional per se and will therefore not be further explained. The output signal of circuit 3 is applied to an input E1 of a variable gain amplifier 4 with differential inputs E1, E2. This amplifier 4 receives on its other differential input E2 the voltage level Vf. The output of amplifier 4 is applied to an input of an adder 5. Amplifier 4 has a third input E3 in order to receive a gain control signal. Adder 5 has a second input in order to receive a signal that will permit an adjustment of the voltage level which is applied to the input of a voltage-controlled oscillator 6. Output 60 of oscillator 6 provides the frequency modulated luminance signal FM.

A reference frequency generator 7 is adapted to produce reference frequencies $f_{min}$ and $f_{max}$; those frequencies which are available at the output 70, will permit to control the frequencies $f_{min}$ and $f_{max}$ of the modulated video signal.

Generator 7 produces the frequency $f_{min}$ under the control of a signal I1 which is also applied to the insertion circuit 2.

Signal I1 shown in FIG. 3 is synchronized with the frame return pulse RT and permits to insert into the video signal a blanking signal which corresponds to the black level, for a period of half a line in order to get a non-noisy black level during this period which is sufficiently long. It is thus advisable to carry out the insertion during the frame return phase since the level is existing at that time, for a larger period than during the line return period, for example.

Generator 7 produces a frequency $f_{max}$ under the control of a signal I2 which is also applied to insertion circuit 2. Signal I2 shown in FIG. 3 corresponds to a pulse having a duration equal to one line and which triggers, after the pulse of signal I1, the reinsertion of the white level into the video signal during the frame return phase.

A discrimination circuit 8 receives on one input the reference frequency f réf produced by generator 7 and on another input the output frequency modulated signal FM from oscillator 6.

The discrimination circuit provides two voltage levels e1 and e2 at its outputs, one of which is dependent upon the output frequency of oscillator 6 and the other one is dependent upon the input reference frequency.

Those two levels e1 and e2 are respectively applied to one input of a differential amplifier 9 which produces a voltage level equal to the difference between the input levels. The output of comparator 9 is connected with a switch 10 through a resistor R.

When the reference frequency produced is the reference for $f_{max}$, the output voltage of amplifier 9 is applied through switch 10 to a terminal of a capacitor 11, the other terminal of which is grounded. Capacitor 11 is being charged when the switch is put on position A, this position being triggered by a signal I4 shown in FIG. 3.

When the reference frequency produced is the $f_{min}$ reference, the output voltage of amplifier 9 is applied through switch 10 to a terminal of a capacitor 12, the other terminal of which is grounded. Capacitor 12 is being charged when the switch is put on position B, this position being controlled by a signal I3 shown in FIG. 3.

During the insertion of the blanking level, the output level of amplifier 9 corresponds to the frequency difference between the reference frequency $f_{min}$ which is produced and applied at the input of the discriminator and the modulation frequency. This voltage difference permits to charge and discharge capacitor 12. This voltage difference modifies the charge of the capacitor through resistor R with a short time constant, which permits to modify the output frequency of oscillator 6 until voltages e1 and e2 are equal.

During the insertion of the maximum white, the output level of amplifier 9 corresponds to the difference in frequency between the reference frequency $f_{max}$ which is produced and applied at the input of the discriminator and the modulation frequency $f_{max}$. This voltage difference permits to charge or discharge capacitor 11. This voltage difference modifies the charge of the capacitor with a short time constant and therefore the output frequency of oscillator 6, until voltages e1 and e2 are equal.

Capacitor 11 and 12 are used as storage means between two frequency measurements. The duration between two measurements is at least equal to 40 ms (duration of two frames). The discharge time constant must be long enough to avoid frequency variations between two measurements. The discharge of capacitors 11 and 12 is very slow and corresponds to the input current of the gain control stage of the multiplier 4 for capacitor 11 and to the input current of the adder 5 for capacitor 12. Currents are base currents of transistors having a collector current Ic equal to 10 µA and a gain B of 125, that is a base current Ib equal to 80 nA.

In order to obtain an independence between the two servo-control loops the blanking minimum voltage level Vf is injected into the second input of amplifier 4 which is preferably carried out by a differential input multiplier Thus, the multiplier acts upon the difference between voltages V and Vf that is V−Vf which permits to obtain a focussing adjustment between the setting obtained by the multiplier and the adder.

In FIG. 2, another embodiment of the discrimination circuit 8 is shown. According to this other embodiment, the circuit comprises only one discriminator 84 for obtaining the two voltage levels e1 and e2. In fact, this discriminator 84 permits by means of a switch 83 to alternatively receive, either one reference frequency, either the other reference frequency, or the frequency modulated signal. To achieve this purpose, a terminal A of the switch 83 is connected with terminal 70 and the other terminal B is connected with terminal 60 while the actuator is connected with the input of the discriminator 84. The output of the discriminator permits through a switch 85 to successively output a voltage level e1 for one reference frequency (for example $f_{min}$) which charges a capacitor 86 while the voltage level e2, corresponding to the frequency modulated signal FM, is not available, in order to apply level e1 to one input of amplifier 9 and level e2 to the other input of amplifier 9 shown in FIG. 1. A terminal A of switch 85 is connected with one input of amplifier 9, the other terminal B is connected with the other input of the amplifier, the actuator being connected with the output of the discriminator.

Signals I5, I6 permit to put switch 83 on positions A and B, respectively, and signals I7 and I8 permit to put switch 85 on positions A and B, respectively. Before the signal I1 is applied to control the blanking level reinsertion, a pulse of signal I5 permits to put switch 83 in position A, and simultaneously, a pulse of signal I7 permits to put switch 85 in position A. When those two switches are in position A, capacitor 86 is charged by the output voltage e1 of discriminator 84, corresponding to one of the reference frequencies $f_{min}$ or $f_{max}$. During the reinsertion phase of the blanking level, a pulse from signal I6 permits to put switch 83 on position B and a pulse from signal I8 permits to put switch 85 on position B as well, the voltage levels e1 corresponding to the frequency $f_{min}$ and e2 corresponding to the modulated signal, will then permit to act upon adder 5 through amplifier 9 and switch 10 shown in FIG. 1.

Prior to the reinsertion phase of the white level, that is before signal pulse I2, second pulses of signals I5 and I8 permit to put switches 83 and 85 on position A, so that a new voltage level e1, corresponding to the other reference frequency, that is $f_{max}$, permits to charge capacitor 86.

During the reinsertion phase of the maximum white, that is during signal pulse I2, a second pulse of signal E6 permits to put switch 83 in position B and a second pulse of signal E8 permits to put switch 85 in position B. The voltage levels e1 corresponding to the frequency $f_{max}$ and e2 corresponding to the modulated signal, will permit to act upon multiplier 4 through amplifier 9 and switch 10 shown in FIG. 1. Capacitor 86 must store information during one line only, its value is approximately 50 pF which makes it easily integrable.

The pulses of signal I8 are preferably delayed with respect to the pulses of signal I6, exactly like signals I3 and I4 with respect to signals I1 and I2 for taking into account the delay entered in discriminator 84 (or discriminators 81 and 82).

Figure 4:
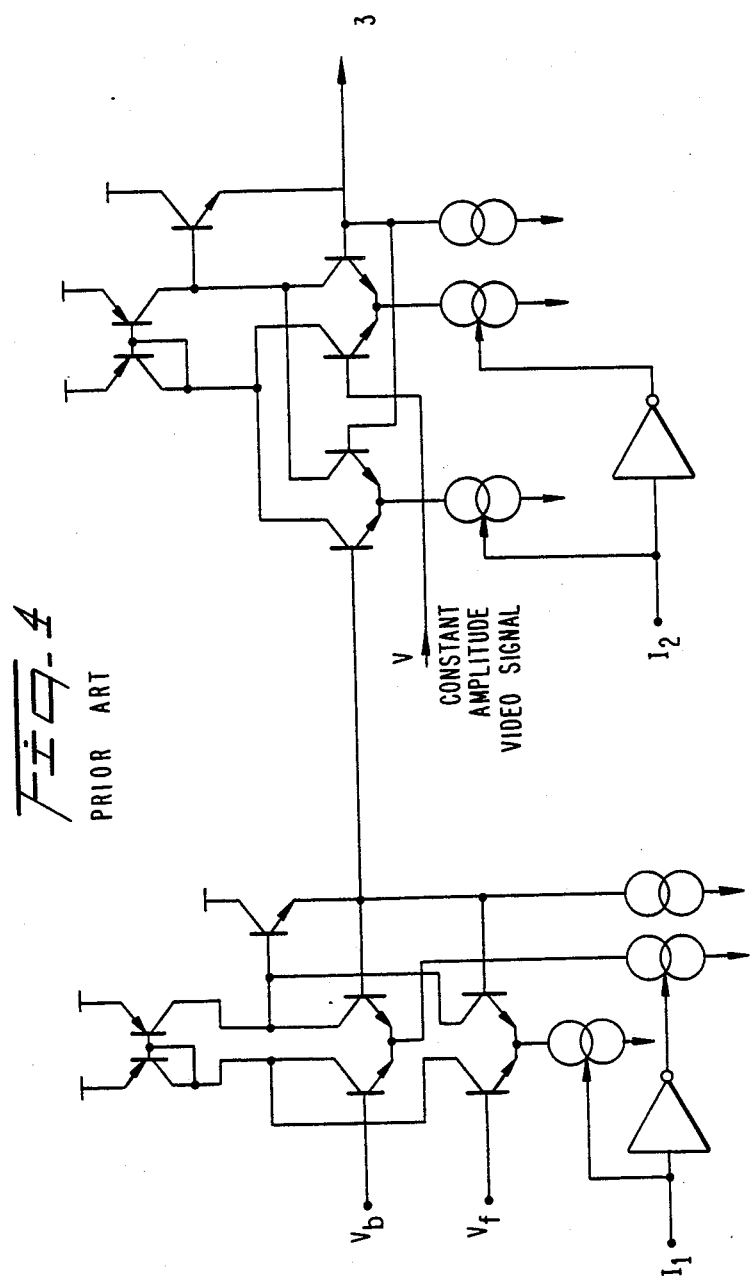
FIG. 4 shows an embodiment of the insertion block 2 of FIG. 1.

In FIG. 4, one has shown, just for the sake of guidance, a conventional embodiment of an insertion cirucirt 2 which permits to insert levels Vf and Vb.

We claim:

1. A setting device for minimum and maximum reference frequencies $f_{min}$ and $f_{max}$ of a frequency modulated video signal, comprising in series an automatic gain control amplifier (1), a processing circuit of the luminance signal (3), a variable gain amplifier (4), an adder (5), a voltage-controlled oscillator (6), further comprising:
   an insertion circuit (2) located between the AGC amplifier (1) and the processing circuit (3), which receives from the amplifier a first reference voltage level (Vf) corresponding to the minimum reference frequency $f_{min}$ and a second reference voltage level (Vb) corresponding to the maximum reference frequency $f_{max}$, respectively synchronized with first (I1) and second (I2) control signals;
   a frequency generator (7) adapted to produce said two reference frequencies $f_{min}$ and $f_{max}$ synchronized with the control signals (I1, I2);
   a discrimination circuit (8) which receives at one input, in relation with the control signals, either the minimum reference frequency $f_{min}$, or the maximum reference frequency $f_{max}$ from the generator (7) and at another input the frequency modulated video signal (FM) of the output of said voltage-controlled oscillator (6), and which provides two voltage levels (e1, e2) in relation with said input frequencies;
   a comparator (9) receiving on each of its inputs one of said two voltage levels from the discrimination circuit (8) and providing a difference voltage level corresponding to the difference between said two input voltage levels; and
   a switch (10) connected with the output of said comparator (9) and controlled by third and fourth control signals (I3 and I4) in order that the output level of the comparator permits either to control the setting of the gain of the variable gain amplifier, or to feed one of the inputs of the adder depending on whether the reference frequency at the input of the discriminator is the minimum frequency or the maximum frequency in order to servo-control said frequency modulated video signal from the voltage controlled oscillator either by the reference frequency $f_{min}$, or by the reference frequency $f_{max}$.

2. A device according to claim 1, wherein the discrimination circuit (8) comprises a first (81) discriminator receiving one of said two reference frequencies emitted by the frequency generator (7) and respectively providing a first or a second voltage level; a second discriminator (82) receiving the frequency modulated signal emitted by said voltage controlled oscillator (6) and providing a third voltage level.

3. A device according to claim 1, wherein the discrimination circuit (8) comprises:
   a first switch (83), a first terminal (A) of which is connected with the output (70) of the frequency generator (7), and a second terminal (B) of which is connected with the output (70) of the voltage controlled oscillator (6);
   a discriminator (84), the input of which is connected with the actuator of the first switch (83), said discriminator (83) receiving either said minimum reference frequency ($f_{min}$), said maximum reference frequency ($f_{max}$), or the frequency modulated video signal (FM) according to the position of the actuator which is controlled by fifth (I5) and sixth (I6) control signals;
   a second switch (85), the actuator of which is connected with the output of the discriminator, a terminal (A) of which is connected with one of said inputs of the comparator (9), and the other terminal of which is connected with a second of said inputs of the comparator; and
   a capacitor (86), a terminal of which is connected with one of said terminals of the second switch (85), and the other terminal being grounded.

4. A device according to claim 1, further comprising a first capacitor (11), a terminal of which is connected with a gain control input of the variable gain amplifier (4), said gain control input being also connected with a terminal (A) of said switch (10) located at the output of said comparator (9), and the other terminal of which is grounded; and a second capacitor (12), a terminal of which is grounded and the other terminal of which is connected with a second input of the adder (5), this second input being conencted with a second terminal (B) of said switch (10).

5. A device according to claim 1, wherein the variable gain amplifier (4) comprises a multiplier with differential inputs receiving at a frist differential input and output signal of the processing circuit (3) and the blanking signal at a second differential input.

* * * * *